(12) United States Patent
Youn et al.

(10) Patent No.: US 10,873,057 B2
(45) Date of Patent: Dec. 22, 2020

(54) ELECTROLUMINESCENCE DISPLAY APPARATUS

(71) Applicant: LG Display Co., Ltd., Seoul (KR)

(72) Inventors: JunHo Youn, Paju-si (KR); Heumell Baek, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/212,533

(22) Filed: Dec. 6, 2018

(65) Prior Publication Data

US 2019/0189969 A1 Jun. 20, 2019

(30) Foreign Application Priority Data

Dec. 14, 2017 (KR) .................. 10-2017-0172048

(51) Int. Cl.
*H01L 51/52* (2006.01)
*H01L 27/32* (2006.01)
*H01L 51/50* (2006.01)

(52) U.S. Cl.
CPC ........ *H01L 51/5278* (2013.01); *H01L 27/322* (2013.01); *H01L 27/3211* (2013.01);
(Continued)

(58) Field of Classification Search
CPC ............... H01L 51/504; H01L 51/5056; H01L 51/5072; H01L 51/5092; H01L 51/5265;
(Continued)

(56) References Cited

U.S. PATENT DOCUMENTS 8,823,019 B2 9/2014 Kim et al.
9,929,342 B2 3/2018 Dai
(Continued)

FOREIGN PATENT DOCUMENTS

CN 1832646 A 9/2006
CN 105774279 A 7/2016
(Continued)

OTHER PUBLICATIONS

China National Intellectual Property Administration, Office Action, CN Patent Application No. 201811493728.7, dated Sep. 25, 2020, 17 pages.

*Primary Examiner* — Vongsavanh Sengdara
(74) *Attorney, Agent, or Firm* — Fenwick & West LLP

(57) ABSTRACT

An electroluminescence display includes a substrate, a bank defining a first light emitting area, a second light emitting area, and a third light emitting area on the substrate, a first light emitting layer provided in the first light emitting area, a second light emitting layer provided in the second light emitting area, a third light emitting layer provided in the third light emitting area, and a fourth light emitting layer provided on the first light emitting layer, the second light emitting layer, the third light emitting layer, and the bank, wherein the fourth light emitting layer emits light having the same color light of the third light emitting layer. If red light is emitted from the first light emitting layer, green light is emitted from the second light emitting layer, and blue light is emitted from the third light emitting layer and the fourth light emitting layer, the luminous efficiency of blue light can be improved.

20 Claims, 8 Drawing Sheets

(52) U.S. Cl.
CPC ...... *H01L 27/3223* (2013.01); *H01L 27/3246* (2013.01); *H01L 51/504* (2013.01); *H01L 51/5056* (2013.01); *H01L 51/5072* (2013.01); *H01L 51/5092* (2013.01); *H01L 2251/558* (2013.01)

(58) Field of Classification Search
CPC ............. H01L 51/5278; H01L 27/3246; H01L 27/3223; H01L 27/322; H01L 27/3211
See application file for complete search history.

(56) References Cited

U.S. PATENT DOCUMENTS

| | | | |
|---|---|---|---|
| 9,989,806 B2 | 6/2018 | Lee et al. | |
| 2003/0156079 A1* | 8/2003 | Nakanishi | H01L 27/3265 345/45 |
| 2004/0018677 A1* | 1/2004 | Nakanishi | H01L 27/12 438/222 |
| 2004/0041753 A1* | 3/2004 | Nakanishi | H01L 27/3211 345/76 |
| 2009/0251051 A1* | 10/2009 | Hwang | H01L 27/3213 313/504 |
| 2011/0180825 A1* | 7/2011 | Lee | H01L 27/3206 257/89 |
| 2012/0161114 A1 | 6/2012 | Kim et al. | |
| 2012/0168787 A1* | 7/2012 | Okumoto | H01L 27/3211 257/89 |
| 2013/0001610 A1* | 1/2013 | Iwakura | H01L 27/3223 257/91 |
| 2013/0048986 A1* | 2/2013 | Lee | H01L 27/3211 257/52 |
| 2014/0117334 A1* | 5/2014 | Nakamura | H01L 51/5203 257/40 |
| 2014/0117842 A1* | 5/2014 | Hanamura | H01L 27/3248 313/504 |
| 2014/0183471 A1* | 7/2014 | Heo | H01L 51/504 257/40 |
| 2017/0076678 A1 | 3/2017 | Lee et al. | |
| 2017/0125494 A1* | 5/2017 | Matsusue | H01L 51/5206 |
| 2017/0279049 A1 | 9/2017 | Dai | |
| 2018/0374909 A1* | 12/2018 | Nishikiori | H01L 27/3246 |

FOREIGN PATENT DOCUMENTS

| | | |
|---|---|---|
| CN | 106526947 A | 3/2017 |
| KR | 10-0759576 B | 9/2007 |
| KR | 10-1419247 B | 7/2014 |
| KR | 10-2016-0083396 A | 7/2016 |

\* cited by examiner

ELECTROLUMINESCENCE DISPLAY APPARATUS

CROSS-REFERENCE TO RELATED APPLICATIONS

This application claims the benefit of the Republic of Korea Patent Application No. 10-2017-0172048 filed on Dec. 14, 2017, which is incorporated by reference in its entirety.

BACKGROUND

Technical Field

The present disclosure relates to an electroluminescence display apparatus, and more particularly, to an electroluminescence display apparatus which may be manufactured through a solution process.

Discussion of the Related Art

An electroluminescence display apparatus has a structure in which a light emitting layer is formed between two electrodes and displays an image as the light emitting layer emits light by an electric field between the two electrodes.

The light emitting layer may be formed of an organic material in which electrons and holes are combined to generate excitons and the generated excitons fall from an excited state to a ground state to emit light, or formed of an inorganic material such as quantum dots.

Hereinafter, a related art electroluminescence display apparatus will be described with reference to the accompanying drawings.

FIG. 1 is a schematic cross-sectional view of the related art electroluminescence display apparatus.

As illustrated in FIG. 1, the related art electroluminescence display apparatus includes a substrate 10, a circuit element layer 20, a first electrode 30, a bank 40, and a light emitting layer 50.

The circuit element layer 20 is formed on the substrate 10. In the circuit element layer 20, various signal lines, thin film transistors (TFTs), capacitors, and the like, are formed.

The first electrode 30 is formed on the circuit element layer 20. The first electrode 30 is patterned at each pixel and serves as an anode of the electroluminescence display apparatus.

The banks 40 are formed in a matrix structure to define a plurality of light emitting areas.

The light emitting layer 50 is formed at each of the plurality of light emitting areas defined by the banks 40. The light emitting layer 50 includes a red (R) light emitting layer, a green (G) light emitting layer, and a blue (B) light emitting layer formed at each light emitting area. The light emitting layer 50 is formed at each of the plurality of light emitting areas through a solution process using ink jet equipment, or the like.

In the related art electroluminescence display apparatus, efficiency of the blue (B) light emitting layer is lower than that of the red (R) light emitting layer and the green (G) light emitting layer, resulting in a degradation of brightness of the display apparatus.

SUMMARY

Accordingly, the present disclosure is directed to provide an electroluminescence display apparatus that substantially obviates one or more problems due to limitations and disadvantages of the related art.

An aspect of the present disclosure is directed to provide an electroluminescence display apparatus capable of improving efficiency of a blue light emitting layer.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescence display apparatus including a substrate; a bank on the substrate, the bank defining a first light emitting area, a second light emitting area, and a third light emitting area of the substrate; a first light emitting layer provided in the first light emitting area, the first light emitting layer configured to emit light of a first color; a second light emitting layer provided in the second light emitting area, the second light emitting layer configured to emit light of a second color; a third light emitting layer provided in the third light emitting area, the third light emitting layer configured to emit light of a third color; and a fourth light emitting layer provided on the first light emitting layer, the second light emitting layer, the third light emitting layer, and the bank, wherein the fourth light emitting layer is configured to emit light of the third color that is also emitted by the third light emitting layer.

In another aspect of the present disclosure, there is provided an electroluminescence display apparatus including a substrate including an active area and a dummy area provided on an outer side of the active area; a bank on the substrate, the bank defining a plurality of light emitting areas in the active area on the substrate and defining a plurality of dummy light emitting areas in the dummy area on the substrate, wherein the light emitting areas are configured to emit light and the dummy light emitting areas do not emit light; a first light emitting layer, a second light emitting layer, and a third light emitting layer respectively provided in the plurality of light emitting areas, the first light emitting layer configured to emit light of a first color, the second light emitting layer configured to emit light of a second color, and the third light emitting layer configured to emit light of a third color; a fourth light emitting layer on the first light emitting layer, the second light emitting layer, the third light emitting layer, and the bank in the active area, the fourth light emitting layer configured to emit light of the third color that is also emitted by the third light emitting layer; and a dummy light emitting layer provided in each of the plurality of dummy light emitting areas.

In another aspect of the present disclosure, there is provided a display apparatus including a substrate and a plurality of pixels arranged on the substrate. A least one pixel includes a first a first subpixel configured to emit light of a first color, a second subpixel configured to emit light of a second color, a third subpixel configured to emit light of a third color and a fourth subpixel overlapping the first subpixel, the second subpixel, and the third subpixel, wherein the fourth subpixel is configured to emit light that is of a same color as one of the first subpixel, the second subpixel, or the third subpixel.

In some embodiments, the fourth subpixel emits light of the third color.

In some embodiments, a first light emitting area of the first subpixel, a second light emitting area of the second subpixel, and a third light emitting area of the third subpixel are defined by a bank, and a size of the first light emitting area, a size of the second light emitting area, and a size of the third light emitting area are substantially the same.

In some embodiments, the display apparatus further comprises a first color filter overlapping the first subpixel and the fourth subpixel; a second color filter overlapping the second subpixel and the fourth subpixel; and a third color filter overlapping the third subpixel and the fourth subpixel, wherein each of the first color filter and the second color filter at least partially block transmission of light emitted from the fourth subpixel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and, together with the description, serve to explain the principle of the disclosure. In the drawings.

DETAILED DESCRIPTION OF THE DISCLOSURE

Figure 1:
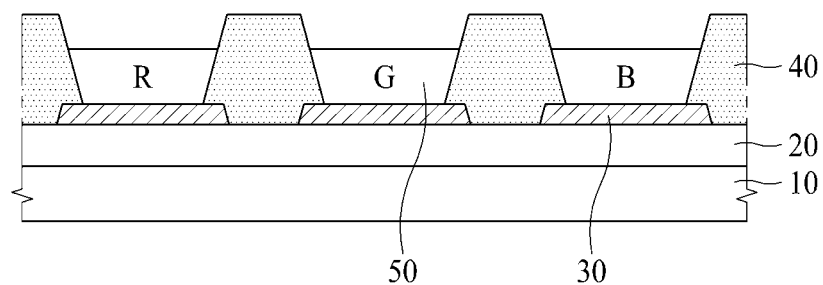
FIG. 1 is a schematic cross-sectional view of the related art electroluminescence display apparatus, according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
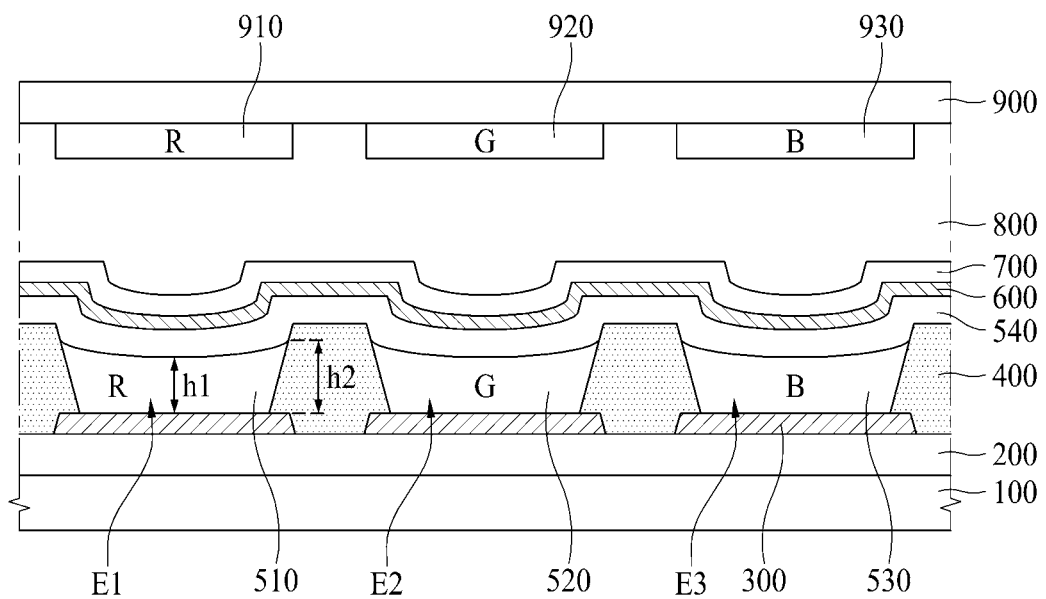
FIG. 2 is a schematic cross-sectional view of an electroluminescence display apparatus according to an embodiment of the present disclosure.

FIG. 2 is a schematic cross-sectional view of an electroluminescence display apparatus according to an embodiment of the present disclosure.

As illustrated in FIG. 2, the electroluminescence display apparatus according to an embodiment of the present disclosure includes a first substrate 100, a circuit element layer 200, a first electrode 300, a bank 400, a first light emitting layer 510, a second light emitting layer 520, a third light emitting layer 530, a fourth light emitting layer 540, a second electrode 600, a capping layer 700, an encapsulation layer 800, a second substrate 900, and color filters 910, 920, and 930.

The first substrate 100 may be formed of glass or plastic but is not limited thereto. The substrate 100 may be formed of a transparent material or an opaque material.

The electroluminescence display apparatus according to an embodiment of the present disclosure may be configured as a so-called top emission type in which emitted light is emitted upwards, and here, an opaque material, as well as a transparent material, may be used as a material of the substrate 100.

The circuit element layer 200 is formed on the first substrate 100.

In the circuit element layer 200, circuit elements including various signal lines, thin film transistors (TFTs), capacitors, and the like, are provided at each pixel. The signal lines may include a gate line, a data line, a power line, and a reference line, and the TFTs may include a switching TFT, a driving TFT, and a sensing TFT.

The switching TFT is switched according to a gate signal supplied to the gate line to serve to supply a data voltage supplied from the data line to the driving TFT.

The driving TFT is switched according to a data voltage supplied from the switching TFT to generate a data current from power supplied from the power line and supply the generated data current to the first electrode 300.

The sensing TFT serves to sense a variation of a threshold voltage of the driving TFT which degrades image quality. The sensing TFT supplies a current from the driving TFT to the reference line in response to a sensing control signal supplied from the gate line or a separate sensing line.

The capacitor, which serves to maintain a data voltage supplied to the driving TFT during one frame, is connected to a gate terminal and a source terminal of the driving TFT.

The first electrode 300 may be formed on the circuit element layer 200. The first electrode 300 may be patterned at each pixel and serve as an anode of the electroluminescence display apparatus. The first electrode 300 is connected to a driving TFT provided in the circuit element layer 200.

In case where the electroluminescence display apparatus according to an embodiment of the present disclosure is configured as a top emission type, the first electrode 300 may include a reflective material for reflecting light, which is emitted from the light emitting layer 500, upwards. In this case, the first electrode 300 may have a stacked structure including a transparent conductive material and the reflective material.

In some embodiments, the bank 400 is formed to have a matrix structure at the boundary between a plurality of pixels and defines light emitting areas E1, E2, and E3 at each of the plurality of pixels. That is, the openings where the banks 400 are not formed in each pixel become the light emitting areas E1, E2, and E3. In one embodiment, a pixel may include a plurality of subpixels. For example, the light emitting areas E1, E2, and E3 are light emitting areas for three separate subpixels of a single pixel.

The bank 400 is formed on the circuit element layer 200 and covers both ends of the first electrode 300. Accordingly, a plurality of first electrodes 300 respectively patterned at the plurality of pixels may be insulated by the banks 400.

The bank 400 may be formed of an organic insulating material having hydrophilic properties. In this case, the first, second, and third light emitting layers 510, 520, and 530 may be uniformly formed in the light emitting areas E1, E2, and E3 to easily spread to the sides of the bank 400.

If the entirety of the bank 400 has hydrophilic properties, the first, second, and third light emitting layers 510, 520, and 530 respectively formed in the light emitting areas E1, E2, and E3 may overflow to the other neighboring light emitting areas E1, E2, and E3 by way of the upper surfaces of the banks 400 and may be mixed with the neighboring first, second, and third light emitting layers 510, 520, and 530. Therefore, in order to prevent the neighboring first, second, and third light emitting layers 510, 520, and 530 from being mixed with each other, upper surfaces of the banks 400 may have hydrophobic properties.

To this end, the bank 400 may be patterned through a photolithography process after applying a solution obtained by mixing a hydrophobic material such as fluorine with an organic insulating material having hydrophilic properties. The hydrophobic material such as fluorine may move to an upper portion of the bank 400 by light irradiated in the photolithography process, and accordingly, the upper portion of the bank 400 may have hydrophobic properties and the other portions may have hydrophilic properties. In this case, since the upper surface of the bank 400 has the hydrophobic properties, the degree to which the neighboring first, second, and third light emitting layers 510, 520, and 530 are spread to the upper surface of the bank 400 may be reduced, reducing the problem of layer mixing.

The first, second, and third light emitting layers 510, 520, and 530 are formed on the first electrode 300. Specifically, in some embodiments, the first, second, and third light emitting layers 510, 520, and 530 are formed in the light emitting areas E1, E2, and E3 defined by the banks 400, respectively.

The first, second, and third light emitting layers 510, 520, and 530 are respectively patterned in the light emitting areas E1, E2, and E3, without a mask, through a solution process. In this case, after the solution for the first, second, and third light emitting layers 510, 520, and 530 is dried, a height h1 of the upper end of each of the first, second, and third light emitting layers 510, 520, and 530 at a central portion of the each of the light emitting areas E1, E2, and E3 may be lower than a height h2 of the upper end of each of the first, second, and third light emitting layers 510, 520, and 530 at the end in contact with the bank 400. In particular, as illustrated, a profile in which the height of the first, second, and third light emitting layers is gradually lowered toward the central portion of each of the light emitting areas E1, E2, and E3 from the end of each of the light emitting areas E1, E2, and E3 in contact with the bank 400 may be obtained.

The first light emitting layer 510 is provided in the first light emitting area E1 of a first pixel, the second light emitting layer 520 is provided in the second light emitting area E2 of a second pixel, and the third light emitting layer 530 is provided in the third light emitting area E3 of a third pixel. The first light emitting area E1 may be configured to emit red light, the second light emitting area E2 may be configured to emit green (G) light, and the third light emitting area E3 may be configured to emit blue (B) light.

The fourth light emitting layer 540 is formed on the light emitting areas E1, E2, and E3 and on regions between the light emitting areas E1, E2, and E3. Thus, the fourth light emitting layer 540 is formed on an upper surface of each of the first light emitting layer 510 provided in the first light emitting area E1, the second light emitting layer 520 provided in the second light emitting area E2, and the third light emitting layer 530 provided in the third light emitting area E3, and the bank 400 provided between the light emitting areas E1, E2, and E3. The fourth light emitting layer 540 may be formed through a deposition process, instead of a solution process. In some embodiments, the fourth light emitting layer 540 is a subpixel formed on subpixels with light emitting areas E1, E2, and E3.

The fourth light emitting layer 540 may have a profile corresponding to the profile of the first, second, and third light emitting layers 510, 520, and 530 in the light emitting areas E1, E2, and E3.

Specific configurations of the first light emitting layer 510, the second light emitting layer 520, the third light emitting layer 530, and the fourth light emitting layer 540 will be described with reference to FIGS. 3 and 4.

Figure 3:
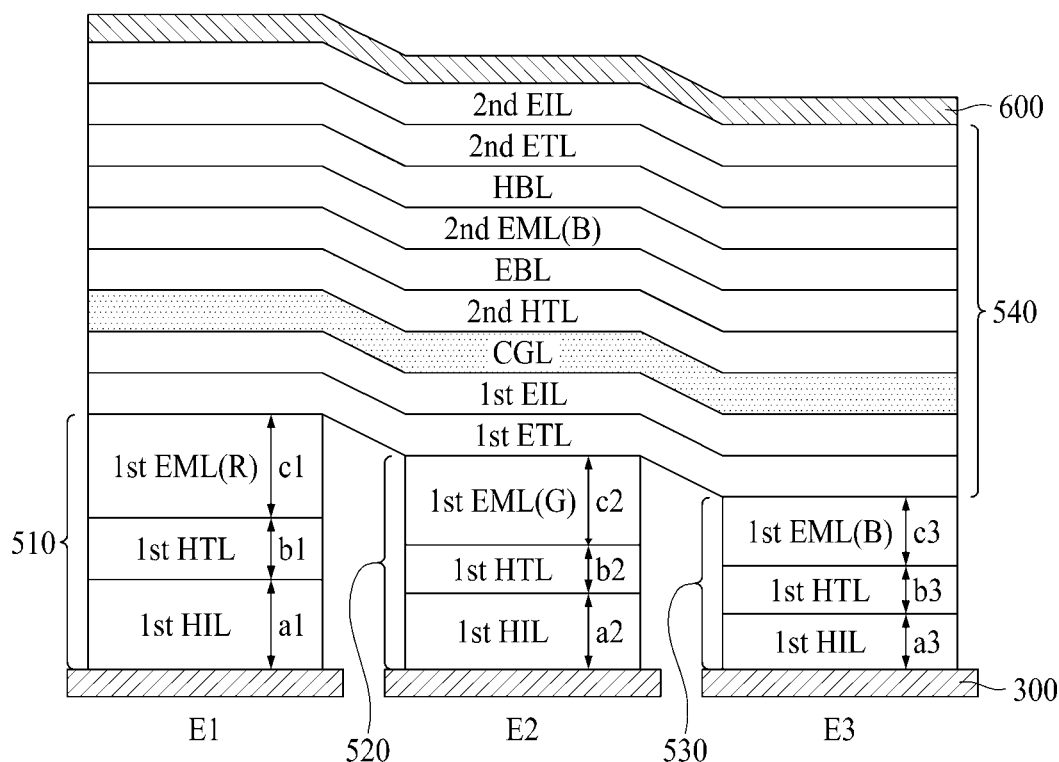
FIG. 3 is a schematic cross-sectional view of a light emitting element constituting an electroluminescence display apparatus according to an embodiment of the present disclosure.
Figure 4:
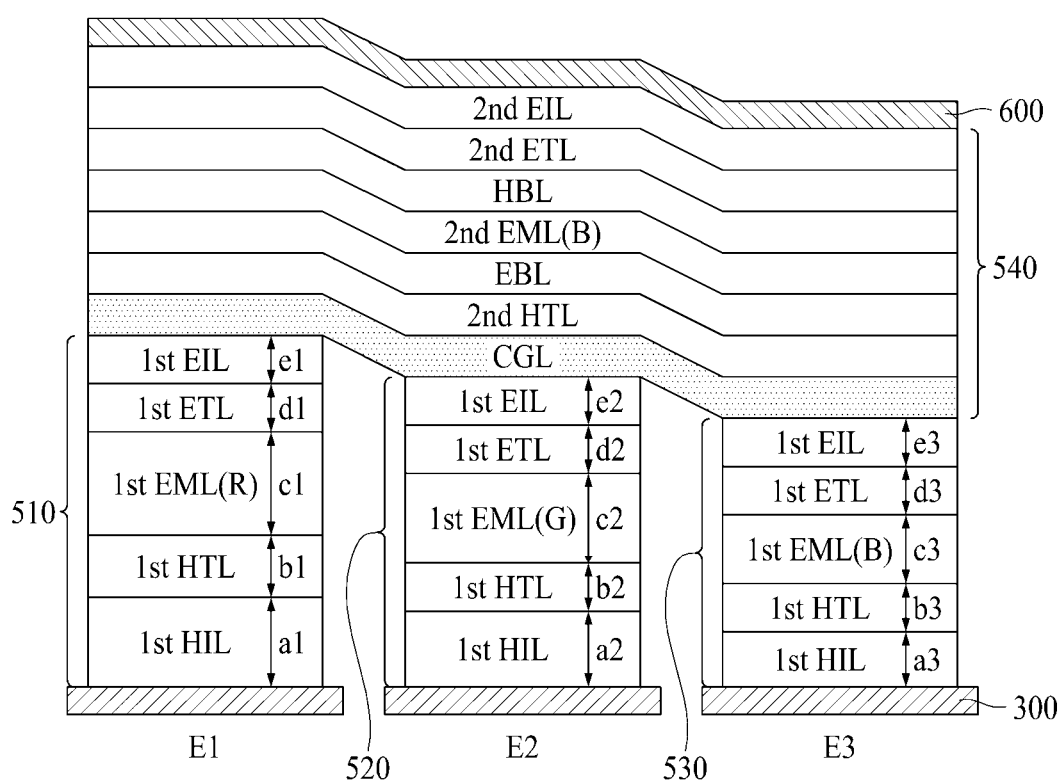
FIG. 4 is a schematic cross-sectional view of a light emitting element constituting an electroluminescence display apparatus according to another embodiment of the present disclosure.

FIG. 3 is a schematic cross-sectional view of a light emitting element constituting an electroluminescence display apparatus according to an embodiment of the present disclosure and FIG. 4 is a schematic cross-sectional view of a light emitting element of an electroluminescence display apparatus according to another embodiment of the present disclosure.

In FIGS. 3 and 4, illustration of a bank is omitted for the sake of convenience, and instead, the regions between the light emitting areas E1, E2, and E3 in which the banks are formed is illustrated as an empty space. Also, in FIGS. 3 and 4, some of the layers formed through the solution process have a profile in which the height decreases from the end to the central portion of the light emitting areas E1, E2, and E3 as described above, but an upper surface of each layer is illustrated as a horizontal plane for the sake of convenience in FIGS. 3 and 4.

As Illustrated in FIG. 3, a first light emitting layer 510, a second light emitting layer 520, a third light emitting layer 530, and a fourth light emitting layer 530 are provided between the first electrode 300 and the second electrode 600.

The first light emitting layer 510 is provided in the first light emitting area E1. The first light emitting layer 510 may include a first hole injecting layer (first HIL), a first hole transporting layer (first HTL), and a first red light emitting material layer (first EML(R)) which are sequentially stacked.

The second light emitting layer 520 is provided in the second light emitting area E2. The second light emitting layer 520 may include a first hole injecting layer (first HIL), a first hole transporting layer (first HTL), and a first green light emitting material layer (first EML(G)) which are sequentially stacked.

The third light emitting layer 530 is provided in the third light emitting area E3. The third light emitting layer 530 may include a first hole injecting layer (first HIL), a first hole transporting layer (first HTL), and a first blue light emitting material layer (first EML(B)) which are sequentially stacked.

The first hole injecting layer (first HIL), the first hole transporting layer (first HTL), the first red light emitting material layer (first EML(R)), the first green light emitting material layer (first EML(G)), and the first blue light emitting material layer (first EML(B)) provided in the first light emitting layer 510, the second light emitting layer 520, and the third light emitting layer 530 are formed through a solution process.

Here, a thickness a1 of the first hole injecting layer (first HIL) provided in the first light emitting layer 510 may be greater than each of a thickness a2 of the first hole injecting layer (first HIL) provided in the second light emitting layer 520 and a thickness a3 of the first hole injecting layer (first HIL) provided in the third light emitting layer 530, and the thickness a2 of the first hole injecting layer (first HIL) provided in the second light emitting layer 520 may be greater than the thickness a3 of the first hole injecting layer (first HIL) provided in the third light emitting layer 530.

A thickness b1 of the first hole transporting layer (first HTL) included in the first light emitting layer 510 may be greater than each of a thickness b2 of the first hole transporting layer (first HTL) provided in the second light emitting layer 520 and a thickness b3 of the first hole transporting layer (first HTL) provided in the third light emitting layer 530, and the thickness b2 of the first hole transporting layer (first HTL) provided in the second light emitting layer 520 may be greater than the thickness b3 of the first hole transporting layer (first HTL) provided in the third light emitting layer 530.

Also, a thickness c1 of the first red light emitting material layer (first EML(R)) provided in the first emitting layer 510 may be greater than each of a thickness c2 of the first green light emitting material layer (first MEL(G)) provided in the second light emitting layer 520 and a thickness c3 of the blue light emitting material layer (first EML(B)) provided in the third light emitting layer 530, and the thickness c2 of the first green light emitting material layer (first EML(G)) provided in the second light emitting layer 520 may be greater than the thickness c3 of the first blue light emitting material layer (first EML(B)) provided in the third light emitting layer 530.

Therefore, the thickness of the first light emitting layer 510 provided in the first light emitting area E1 emitting red (R) may be the greatest, the thickness of the third light emitting layer 530 provided in the third light emitting area E3 emitting blue B may be the smallest, and the thickness of the second light emitting layer 520 provided in the second light emitting area E2 emitting green G may be the median.

When the electroluminescence display apparatus is configured as a top emission type, light emitted from the first, second and third light emitting layers 510, 520 and 530 may be transmitted through the second electrode 600 or partially reflected from the second electrode 600, re-reflected from the first electrode 300, and is transmitted through the second electrode 600, thus displaying an image. Here, when a distance between the first electrode 300 and the second electrode 600 is equal to an integer multiple of a half-wave length ($\lambda/2$) of light emitted from the first, second, and third light emitting layers 510, 520, and 530, constructive interference occurs to amplify light, and when the reflecting and re-reflecting process is repeated, the degree to which light is amplified continues to increase to enhance external extraction efficiency of light. This characteristic may be called a microcavity characteristic.

Therefore, in consideration of the microcavity characteristics, the first light emitting layer 510 that emits light of a long wavelength may be formed to be the thickest, the third light emitting layer 530 that emits light of a short wavelength may be formed to be the thinnest, and the second light emitting layer 520 that emits light in a medium wavelength may be formed to have a middle thickness.

Meanwhile, in each of the first, second, and third light emitting layers 510, 520, and 530, the first hole injecting layer (first HIL) may be omitted. Also, in the first light emitting layer 510, an electron blocking layer EBL may be additionally formed between the first hole transporting layer (first HIL) and the first red light emitting material layer (first EML(R)). In the second light emitting layer 520, an EBL may be additionally formed between the first hole transporting layer (first HTL) and the first green light emitting material layer (first EML(G)). In the third light emitting layer 530, an EBL may be additionally formed between the first hole transporting layer (first HTL) and the first blue light emitting material layer (first EML(B)). Also, in each of the first, second, and third light emitting layers 510, 520, and 530, a hole blocking layer (HBL) may be additionally formed on the first red light emitting material layer (first EML(R)), the first green light emitting material layer (first EML(G)), and the first blue light emitting material layer (first EML(B)). The EBL and the HBL may be formed through a solution process.

The fourth light emitting layer 540 is formed on an upper surface of each of the first light emitting layer 510 in the first light emitting area E1, the second light emitting layer 520 in the second light emitting area E2, and the third light emitting layer 530 in the third light emitting area E3. Also, the fourth light emitting layer 540 can be formed in regions between the light emitting regions E1, E2, and E3, i.e., on the upper surface of each bank 400 described above.

The fourth light emitting layer 540 includes a first electron transporting layer (first ETL), a first electron injecting layer (first EIL), a charge generation layer (CGL), a second hole transporting layer (second HTL), an electron blocking layer (EBL), a second blue light emitting material layer (second EML(B)), a hole blocking layer (HBL), a second electron transporting layer (second ETL), and a second electron injecting layer (second EIL) which are sequentially stacked.

Each of the layers constituting the fourth light emitting layer 540 is formed through a deposition process, and the thickness of each of the layers may be uniformly formed in the light emitting areas E1, E2, and E3 and in the regions between the light emitting areas E1, E2, and E3.

The first electron transporting layer (first ETL) and the first electron injecting layer (first EIL) transfer electrons generated in the charge generation layer CGL to the first red light emitting material layer (first EML(R)) provided in the first light emitting layer 510, the first green light emitting material layer (first EML(G)) provided in the second light emitting layer 520, and the first blue light emitting material layer (first EML(B)) provided in the third light emitting layer 530. However, the first electron injecting layer (first EIL) may be omitted.

Since the first electron transporting layer (first ETL) and the first electron injecting layer (first EIL) are formed through a deposition process, they are included as components of the fourth light emitting layer 540 which collectively refers to the layers formed through the deposition process, but, in actuality, they are layers contributing to light emission of the first light emitting layer 510, the second light emitting layer 520, and the third light emitting layer 530.

Therefore, in the first red light emitting material layer (first EML(R)) of the first light emitting layer 510, holes transferred from the first hole injecting layer (first HIL) and the first hole transporting layer (first HTL) and the electrons transferred from the first electron transporting layer (first ETL) and the first electron injecting layer (first EIL) are combined to emit red (R) light.

Similarly, in the first green light emitting material layer (first EML(G)) of the second light emitting layer 520, holes transferred from the first hole injecting layer (first HIL) and the first hole transporting layer (first HTL) and electrons transferred from the first electron transporting layer (first ETL) and the first electron injecting layer (first EIL) are combined to emit red (R) light.

In the first blue light emitting material layer (first EML(B)) of the third emitting layer 530, holes transferred from the first hole injecting layer (first HIL) and the first hole transporting layer (first HTL) and electrons transferred from the first electron transporting layer (first ETL) and the first electron injecting layer (first EIL) are combined to emit blue (B) light.

The charge generation layer CGL balances charges between the first red light emitting material layer (first EML(R)) and the second blue light emitting material layer (second EML(B)) in the first light emitting area E1, balances charges between the first green light emitting material layer (first EML(G)) and the second blue light emitting material layer (second EML(B)) in the second light emitting area E2, and balances charges between the first blue light emitting material layer (first EML(B)) and the second blue light emitting material layer (second EML(B)) in the third light emitting area E3.

Specifically, the charge generation layer CGL supplies electrons to the first electron injecting layer (first EIL) or the first electron transporting layer (first ETL) which transfer electrons to each of the first red light emitting material layer (first EML(R)), the first green light emitting material layer (first EML(G)), and the first blue light emitting material layer (first EML(B)) and supplies holes to the second hole transporting layer (second HTL) which transfers holes to the second blue light emitting material layer (second EML(B)).

The charge generation layer CGL may include an N-type charge generation layer disposed in contact with the first electron injecting layer (first EIL) or the first electron transporting layer (first ETL) and a P-type charge generation layer disposed in contact with the second hole transporting layer (second HTL).

The second hole transporting layer (second HTL) transfers the holes generated in the charge generation layer CGL to the second blue light emitting material layer (second EML(B)), and the second electron transporting layer (second ETL) and the second electron injecting layer (second EIL) transfer electrons generated in the second electrode 600 to the second blue light emitting material layer (second EML(B)). Therefore, in the second blue light emitting material layer (second EML(B)) in the fourth light emitting layer 540, the holes transferred from the second hole transporting layer (second HTL) and electrons transferred from the second electron transporting layer (second ETL) and the second electron injecting layer (second EIL) are combined to emit blue (B) light.

Here, the electron blocking layer EBL prevents electrons transferred to the second blue light emitting material layer (second EML(B)) from moving to the second hole transporting layer (second HTL) and the hole blocking layer HBL prevents holes transferred to the second blue light emitting material layer (second EML(B)) from moving to the second electron transporting layer (second ETL), thus enhancing luminous efficiency in the second blue light emitting material layer (second EML(B)). However, the electron blocking layer (EBL) and the hole blocking layer (HBL) may be omitted.

As described above, according to an embodiment of the present disclosure, red (R) light is emitted from the first light emitting layer 510, green (G) light is emitted from the second light emitting layer 520, and blue (B) light is emitted from each of the third light emitting layer 530 and the fourth light emitting layer 540. Therefore, since blue (B) light is emitted from the two light emitting layers 530 and 540, luminous efficiency of the blue (B) light may be improved.

In particular, if the fourth light emitting layer 540 is formed by a solution process again after the first light emitting layer 510, the second light emitting layer 520, and the third light emitting layer 530 are formed by the solution process, the first to third light emitting layers 510, 520, and 530, which are already formed, may be damaged by a solvent for forming the fourth light emitting layer 540. Thus, in the present disclosure, the fourth light emitting layer 540 is formed through a deposition process, whereby the first to third light emitting layers 510, 520, and 530 may be prevented from being damaged during the process of forming the fourth light emitting layer 540.

Meanwhile, the first light emitting layer 510 and the second light emitting layer 520 emit red (R) light and green (G) light, respectively, and thus, there is no need to additionally form the fourth light emitting layer 540 emitting blue (B) light. However, in order not to form the fourth light emitting layer 540 on the first light emitting layer 510 and the second light emitting layer 520, regions of the first light emitting layer 510 and the second light emitting layer 520 may need to be covered by a mask when the fourth light emitting layer 540 is formed by a deposition process. In this case, however, manufacturing cost may be increased due to the mask and a process failure may occur due to sagging of the mask. Thus, in an embodiment of the present disclosure, the fourth light emitting layer 540 is formed through a deposition process, without covering the upper surfaces of the first light emitting layer 510, the second light emitting layer 520, and the third light emitting layer 530 and the upper surface of the bank 400, and color filters 910 and 920 are formed in regions corresponding to the first light emitting layer 510 and the second light emitting layer 520, respectively, whereby emission of blue (B) light from the first light emitting area E1 and the second light emitting area E2 may be prevented.

FIG. 4 illustrates a light emitting element which is the same as the light emitting element illustrated in FIG. 3, except that a first electron transporting layer (first ETL) and a first electron injecting layer (first EIL) are formed through a solution process, instead of a deposition process, and each of the first light emitting layer 510, the second light emitting layer 520, and the third light emitting layer 530 includes the first electron transporting layer (first ETL) and the first electron injecting layer (first EIL).

When the first electron transporting layer (first ETL) and the first electron injecting layer (first EIL) are formed by a solution process, the first red light emitting material layer (first EML(R)), the first green light emitting material layer (first EML(G)), and the first blue light emitting material layer (first EML(B)) may be damaged by a solvent forming the solution. In particular, since the first red light emitting material layer (first EML(R)), the first green light emitting material layer (first EML(G)), and the first blue light emitting material layer (first EML(B)) are regions in which light emission occurs, luminous efficiency thereof may be significantly degraded even by small damage.

Therefore, in order to completely prevent damage to the first red light emitting material layer (first EML(R)), the first green light emitting material layer (first EML(G)), and the first blue light emitting material layer (first EML(B)), the first electron transporting layer (first ETL) and the first electron injecting layer (first EIL) can be formed by a deposition process.

However, if a solvent which does not dissolve the first red light emitting material layer (first EML(R)), the first green light emitting material layer (first EML(G)), and the first blue light emitting material layer (first EML(B)) are used as a solvent for forming the first electron transporting layer (first ETL) and the first electron injecting layer (first EIL) through a solution process, the first electron transporting layer (first ETL) and the first electron injecting layer (first EIL) may also be formed through the solution process. FIG. 4 illustrates a corresponding case.

As described above, FIG. 4 illustrates the same structure as that of FIG. 3, except that the first electron transporting layer (first ETL) and the first electron injecting layer (first EIL) are formed through a solution process instead of a deposition process. In FIG. 3, each of the first electron transporting layer (first ETL) and the first electron injecting layer (first EIL) has the same thickness in all of the first light emitting area E1, the second light emitting area E2, and the third light emitting area E3. Thus, in the case of FIG. 4, a thickness d1 of the first electron transporting layer (first ETL) provided in the first light emitting layer 510, a thickness d2 of the first electron transporting layer (first ETL) provided in the second light emitting layer 520, and a thickness d3 of the first electron transporting layer (first ETL) provided in the third light emitting layer 530 may all be equal. Similarly, in FIG. 4, a thickness e1 of the first electron injecting layer (first EIL) provided in the first light emitting layer 510, a thickness e2 of the first electron injecting layer (first EIL) provided in the second light emitting layer 520, and a thickness e3 of the first electron injecting layer (first EIL) provided in the third light emitting layer 530 may be equal.

Referring back to FIG. 2, the second electrode 600 is formed on the fourth light emitting layer 540. The second electrode 600 may serve as a cathode of the electroluminescence display apparatus.

The second electrode 600 is formed on the bank 400 between the light emitting areas E1, E2, and E3, as well as on the light emitting areas E1, E2, and E3, like the fourth light emitting layer 540. Therefore, the second electrode 600 may serve as a common electrode for applying a common voltage to the plurality of pixels.

When the electroluminescence display apparatus according to an embodiment of the present disclosure is configured as a top emission type, the second electrode 600 may be formed of a transparent conductive material to allow light emitted from the light emitting layers 510, 520, 530, and 540 to emit upwards or may have a small thickness to increase transmittance.

The capping layer 700 is formed on the second electrode 600 to prevent the second electrode 600 from being damaged. Accordingly, the capping layer 700 may be formed to cover the entire upper surface of the second electrode 600. The capping layer 700 may be formed of an organic insulating material. However, the capping layer 700 may be omitted.

The encapsulation layer 800 is formed on the capping layer 700 to prevent moisture from penetrating into the light emitting layers 510, 520, 530, and 540. The encapsulation layer 800 may be formed of an inorganic insulating material or may have a structure in which an inorganic insulating material and an organic insulating material are alternately stacked, but the present disclosure is not limited thereto.

The second substrate 900 corresponds to a surface from which light is emitted in the top emission type, and thus, the second substrate 900 may be formed of a transparent material.

The color filters 910, 920, and 930 are formed on the inner surface of the second substrate 900 facing the first substrate 100. The color filters 910, 920 and 930 may include a first color filter 910 corresponding to the first light emitting area E1 and provided in a region facing the first light emitting layer 510, a second color filter 920 provided in a region corresponding to the second light emitting area E2 and facing the second light emitting layer 520, and a third color filter 930 provided in a region corresponding to the third light emitting area E3 and facing the third light emitting layer 530.

The first color filter 910 is provided to allow only light of a color emitted from the first light emitting layer 510 to be transmitted there through. Specifically, the first color filter 910 may be provided to allow only light of red (R) to be transmitted there through. Thus, although blue (B) light is emitted from the fourth light emitting layer 540 provided in the first light emitting area E1, transmission of light of blue (B) emitted from the fourth light emitting layer 540 is blocked by the first color filter 910, and accordingly, only light of red (R) emitted from the first light emitting layer may be emitted from a pixel corresponding to the first light emitting area E1.

The second color filter 920 is provided to allow only light of a color emitted from the second light emitting layer 520 to be transmitted there through. Specifically, the second color filter 920 may be provided to allow only light of green (G) to be transmitted there through. Thus, although blue (B) light is emitted from the fourth light emitting layer 540 provided in the second light emitting area E2, transmission of light of blue (B) emitted from the fourth light emitting layer 540 is blocked by the second color filter 920, and accordingly, only light of green (G) emitted from the second light emitting layer 520 may be emitted from a pixel corresponding to the second light emitting area E2.

The third color filter 930 is provided to allow only light of the color emitted from the third light emitting layer 530 to be transmitted there through. Specifically, the third color filter 930 may allow only light of blue (B) to be transmitted there through. Accordingly, light of blue (B) emitted from the third light emitting layer 530 and the fourth light emitting layer 540 provided in the third light emitting area E3 may be transmitted through the third color filter 930, and thus, blue (B) light emitted from the third light emitting layer 530 and the fourth light emitting layer 540 may be emitted from the pixel corresponding to the third light emitting area E3. When the third color filter 930 is provided, color purity of the blue (B) light emitted from the pixel corresponding to the third light emitting area E3 may be improved. However, the third color filter 930 may be omitted.

Meanwhile, although not shown, a light blocking layer may be additionally provided between the first color filter 910, the second color filter 920, and the third color filter 930 to prevent light from leaking at the boundary between the pixels.

Also, the first color filter 910, the second color filter 920, and the third color filter 930 may not be formed on the inner surface of the second substrate 900 and may be formed on an upper surface of the capping layer 700, specifically, between the capping layer 700 and the encapsulation layer 800.

Figure 5:
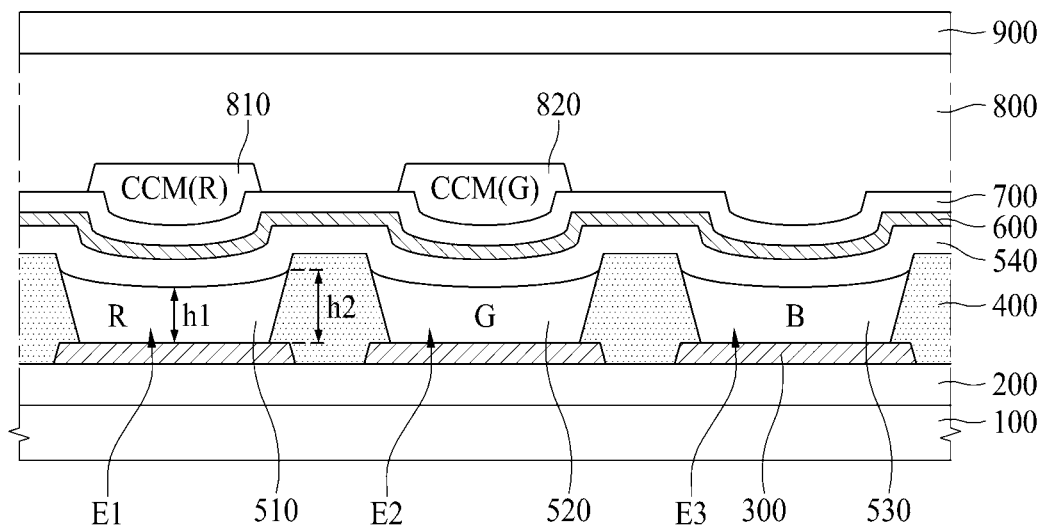
FIG. 5 is a schematic cross-sectional view of an electroluminescence display apparatus according to another embodiment of the present disclosure.

FIG. 5 is a schematic cross-sectional view of an electroluminescence display apparatus according to another embodiment of the present disclosure, which may be the same as the electroluminescence display apparatus illustrated in FIG. 2, except that the color filters 910, 920, and 930 are not provided and color conversion materials 810 and 820 are added instead. Therefore, the same reference numerals are used for the same components, and only a different configuration will be described hereinafter.

Referring to FIG. 5, the color conversion materials 810 and 820 are provided on an upper surface of the capping layer 700, specifically, between the capping layer 700 and the encapsulation layer 800.

The color conversion materials 810 and 820 include a first color conversion material 810 corresponding to the first light emitting area E1 and provided in a region facing the first light emitting layer 510 and a second color conversion material 820 corresponding to the second light emitting area E2 and provided in a region facing the second light emitting layer 520.

The first color conversion material 810 converts light (e.g., of blue (B)) emitted from the fourth light emitting layer 540 provided in the first light emitting area E1 to light having the same color as that of light emitted from the first light emitting layer 510, specifically, red (R) light.

The second color conversion material 820 converts light (e.g., of blue (B)) emitted from the fourth light emitting layer 540 provided in the second light emitting area E2 Into light having the same color as that of light emitted from the second light emitting layer 520, specifically, green (G) light.

Since blue (B) light having a shorter wavelength has energy higher than red (R) light having a longer wavelength and green (G) light having a medium wavelength, blue (B) light having relatively high energy may be converted into red (R) light or green (G) light having relatively low energy. Thus, the first color conversion material 810 is formed of a material that converts blue (B) light into red (R) light, and the second color conversion material 820 is formed of a material that converts blue (B) light into green (G) light.

The color conversion materials 810 and 820 may be formed using at least one selected from the group consisting of a phosphor material such as yttrium aluminum garnet (YAG), a quantum dot, and a dye but the present disclosure is not limited thereto.

In the structure illustrated in FIG. 2, emission of light, which is emitted from the fourth light emitting layer 540, in a pixel corresponding to the first light emitting area E1 and a pixel corresponding to the second light emitting area E2 is blocked by the first color filter 910 and the second color filter 920. In contrast, in the structure illustrated in FIG. 5, blue (B) light emitted from the fourth light emitting layer 540 is converted into red (R) light and green (G) light by the first color conversion material 810 and the second color conversion material 820 to enhance luminous efficiency of the red (R) light and green (G) light in the pixel corresponding to the first emission area E1 and in the pixel corresponding to the second light emitting area E2.

Although not shown, color conversion materials 810 and 820 may be formed on the inner surface of the second substrate 900, instead of between the capping layer 700 and the encapsulation layer 800.

Figure 6:
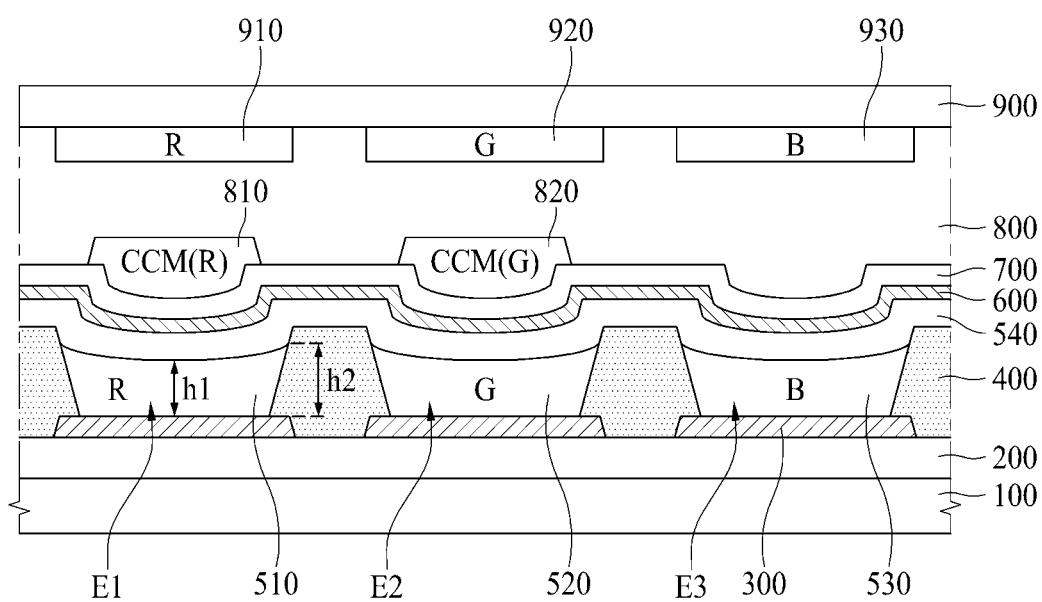
FIG. 6 is a schematic cross-sectional view of an electroluminescence display apparatus according to another embodiment of the present disclosure.

FIG. 6 is a schematic cross-sectional view of an electroluminescence display apparatus according to another embodiment of the present disclosure, in which color conversion materials 810 and 820 according to FIG. 5 are added to the structure according to FIG. 2.

When the color conversion materials 810 and 820 and the color filters 910, 920 and 930 are applied together as illustrated in FIG. 6, luminous efficiency of red (R) light may be enhanced in the pixel corresponding to the first light emitting area E1 and luminous efficiency of green (G) light may be enhanced in the pixel corresponding to the second light emitting area E2 by the color conversion materials 810 and 820, and also, color purity of red (R) light, green (G) light, and blue (B) light may be enhanced by the color filters 910, 920, and 930.

When the color conversion materials 810 and 820 and the color filters 910, 920 and 930 are applied together, the first and second color conversion materials 810 and 820 may need to be disposed to be close to the fourth light emitting layer 540 and the first and second color filters 910 and 920 may need to be distant from the fourth light emitting layer 540. That is, the first and second color conversion materials 810 and 820 are positioned between the first and second color filters 910 and 920 and the fourth light emitting layer 540. If the first and second color filters 910 and 920 are positioned between the first and second color conversion materials 810 and 820 and the fourth light emitting layer 540, transmission of red (R) light and the green (G) light may be blocked by the color filters 910 and 920 and the effect of improving light efficiency by the first and second color conversion materials 810 and 820 may not be obtained.

However, in FIG. 6, the third color filter 930 may not be formed on an inner surface of the second substrate 900 but be formed between the capping layer 700 and the encapsulation layer 800, or in some cases, the third color filter 930 may not be formed.

Figure 7:
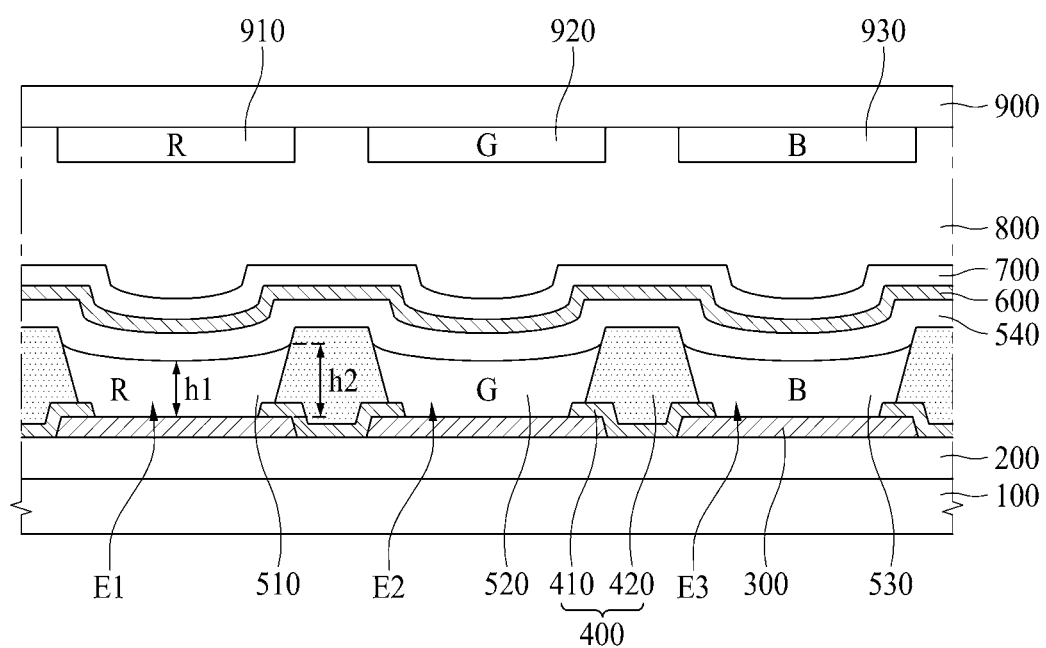
FIG. 7 is a schematic cross-sectional view of an electroluminescence display apparatus according to another embodiment of the present disclosure.

FIG. 7 is a schematic cross-sectional view of an electroluminescence display apparatus according to another embodiment of the present disclosure, which may be the same as the electroluminescence display apparatus of FIG. 2 described above, except that the configuration of the bank 400 is changed. Therefore, the same reference numerals are used for the same components and only the different components will be described below.

Referring to FIG. 7, the bank 400 includes a first bank 410 and a second bank 420.

The first bank 410 is formed on the circuit element layer 200 and covers an end of the first electrode 300. The first bank 410 is formed to be thinner than the second bank 420 and has a width larger than that of the second bank 420. The first bank 410 having such a structure has the same hydrophilic properties as the light emitting layers 510, 520, and 530. The first bank 410 having the hydrophilic properties may be formed of an inorganic insulating material such as silicon oxide. Therefore, when the light emitting layers 510, 520, and 530 are formed through the solution process, a solution for forming the light emitting layers 510, 520, and 530 may be easily spread on the first bank 410.

The second bank 420 is formed on the first bank 410. The second bank 420 is formed to have a width narrower than the first bank 410. The second bank 420 may be patterned through a photolithography process after applying a solution in which a hydrophobic material such as fluorine is mixed with an organic insulating material having hydrophilic properties. The hydrophobic material such as fluorine may be moved to an upper portion of the second bank 420 by light irradiated in the photolithography process, and thus, the upper portion of the second bank 420 has hydrophobic properties and other portions have hydrophilic properties. That is, the lower portion of the second bank 420 in contact with the first bank 410 has hydrophilic properties and the upper portion of the second bank 420 has hydrophobic properties. However, the present disclosure is not limited thereto, and the entire portion of the second bank 420 may have hydrophobic properties.

Spreadability of the solution for forming the light emitting layers 510, 520, and 530 may be improved by the lower portions of the first bank 410 and the second bank 420 having the hydrophilic properties. Particularly, since the first bank 410 is formed be thinner and wider than the second bank 420, the combination of the first bank 410 and the second bank 420 forms a 2-step structure having hydrophilic properties, allowing the solution for forming the light emitting layers 510, 520, and 530 to be easily spread to the left and right ends of the light emitting areas E1, E2, and E3.

Also, since spreading of the solution for forming the light emitting layers 510, 520, and 530 to the neighboring other light emitting areas E1, E2, and E3 by the upper portion of the second bank 420 having the hydrophobic properties, the light emitting layers 510, 520, and 530 may be prevented from being mixed in the neighboring light emitting areas E1, E2, and E3.

Although not shown, in the structure according to FIGS. 5 and 6, the bank 400 may include the first bank 410 and the second bank 420 as illustrated in FIG. 7.

Figure 8:
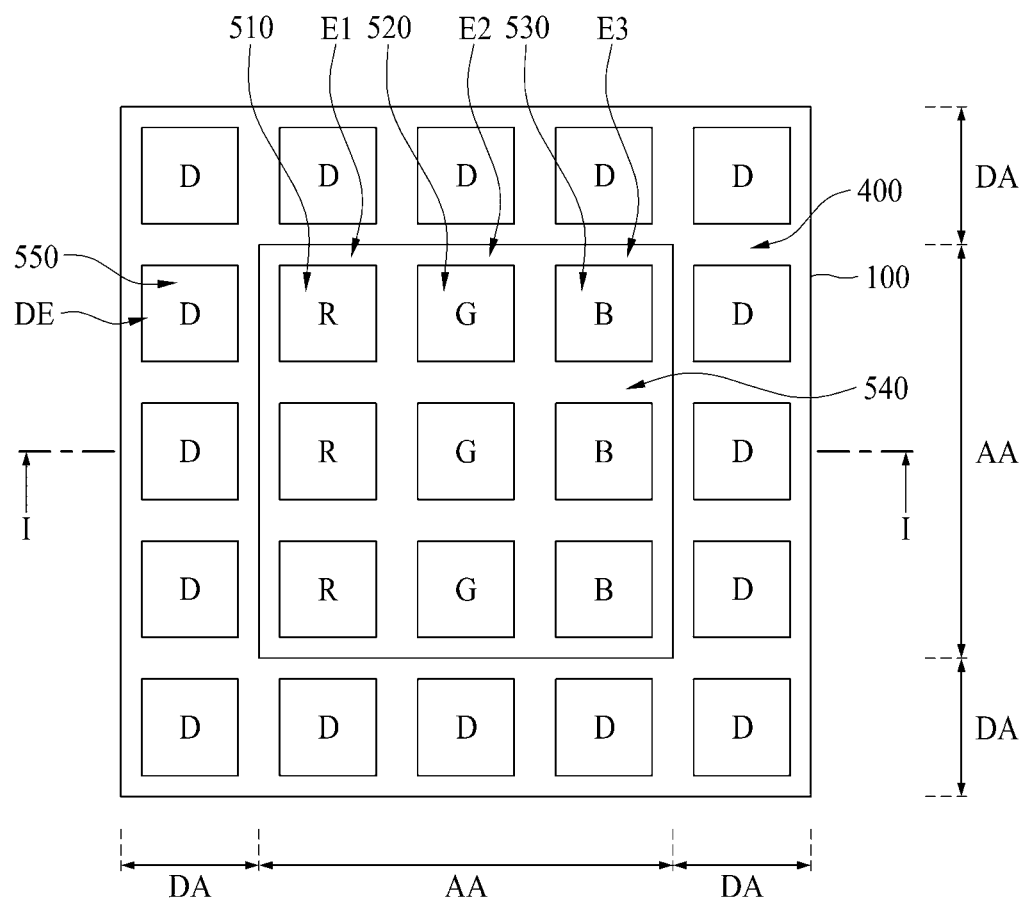
FIG. 8 is a schematic plan view of an electroluminescence display apparatus according to another embodiment of the present disclosure, which relates to an electroluminescence display apparatus including an active area and a dummy area.

FIG. 8 is a schematic plan view of an electroluminescence display apparatus according to another embodiment of the present disclosure, which relates to an electroluminescence display apparatus including an active area AA and a dummy area DA.

The active area AA serves as a display area displaying an image. In some embodiments, the active area AA includes a bank 400 defining a first light emitting area E1, a second light emitting area E2, and a third light emitting area E3. The first light emitting area E1 has the first light emitting layer 510, the second light emitting area E2 has the second light emitting layer 520, and the third light emitting area E3 has a third light emitting layer 530. Also, the fourth light emitting layer 540 is provided on the light emitting areas E1, E2, and E3, and an area between the light emitting areas E1, E2, and E3. The fourth light emitting layer 540 may be formed on the entire active area AA.

The dummy area DA is provided to surround the active area AA. Specifically, the dummy area DA is provided on upper, lower, right, and left outer sides of the active area AA. In some embodiments, the dummy area DA also has the bank 400 defining a dummy light emitting area DE similar to the active area AA and the dummy light emitting area DE has a dummy light emitting layer 550. In some embodiments, the bank 400 has a matrix structure in the entire active area AA and the dummy area DA to define the light emitting areas E1, E2 and E3 and the dummy light emitting area DE.

Since the dummy area DA is not a display area displaying an image, the dummy light emitting area DE in a dummy pixel provided in the dummy area DA does not emit light. The dummy area DA serves to make the profiles of the light emitting layers 510, 520, and 530 at the center of the active area AA and the profiles of the light emitting layers 510, 520, and 530 at the edge of the active area AA uniform.

When the light emitting layers 510, 520, and 530 are formed by a solution process, dry speeds of the light emitting layers 510, 520, and 530 may be different between the center and the edge of the substrate. Therefore, in case where only the active area AA is provided without the dummy area DA, the profiles of the light emitting layers 510, 520, and 530 at the center in the active area AA and the profiles of the light emitting layers 510, 520, and 530 at the edge of the active area AA are not uniform, which may cause light emission between the center and the edge of the active area AA not to be uniform.

Therefore, in another embodiment of the present disclosure, the dummy area DA is formed on the outer side of the active area AA and the light emitting layers 510, 520, and 530 are formed in the active area AA by a solution process. Thus, although the profiles of the dummy light emitting layer 550 and the profiles of the light emitting layers 510, 520, and 530 are not uniform, the profiles of the light emitting layers 510, 520, and 530 may be uniformed in the entire active area AA. For reference, in order to distinguish the dummy light emitting layer 550 which does not emit light from the light emitting layers 510, 520, and 530 respectively emitting red (R), green (G), and blue (B) in FIG. 8, the dummy light emitting layer 550 is indicated by 'D' and this is the same in FIGS. 9 and 10 hereinafter.

As described above, since the dummy area DA is not a display area for displaying an image, it is not necessary to improve luminous efficiency of blue (B) light in the dummy area DA. Therefore, the fourth light emitting layer 540 provided to improve luminous efficiency of blue (B) light in the active area AA is not formed in the dummy area DA. However, the fourth light emitting layer 540 may be formed in the dummy area DA, and in this case, the fourth light emitting layer 540 may be formed in the entire dummy area DA. That is, the fourth light emitting layer 540 may be formed on an upper surface of the dummy light emitting layer 550 and on an upper surface of the bank 400 in the dummy area DA.

Figure 9:
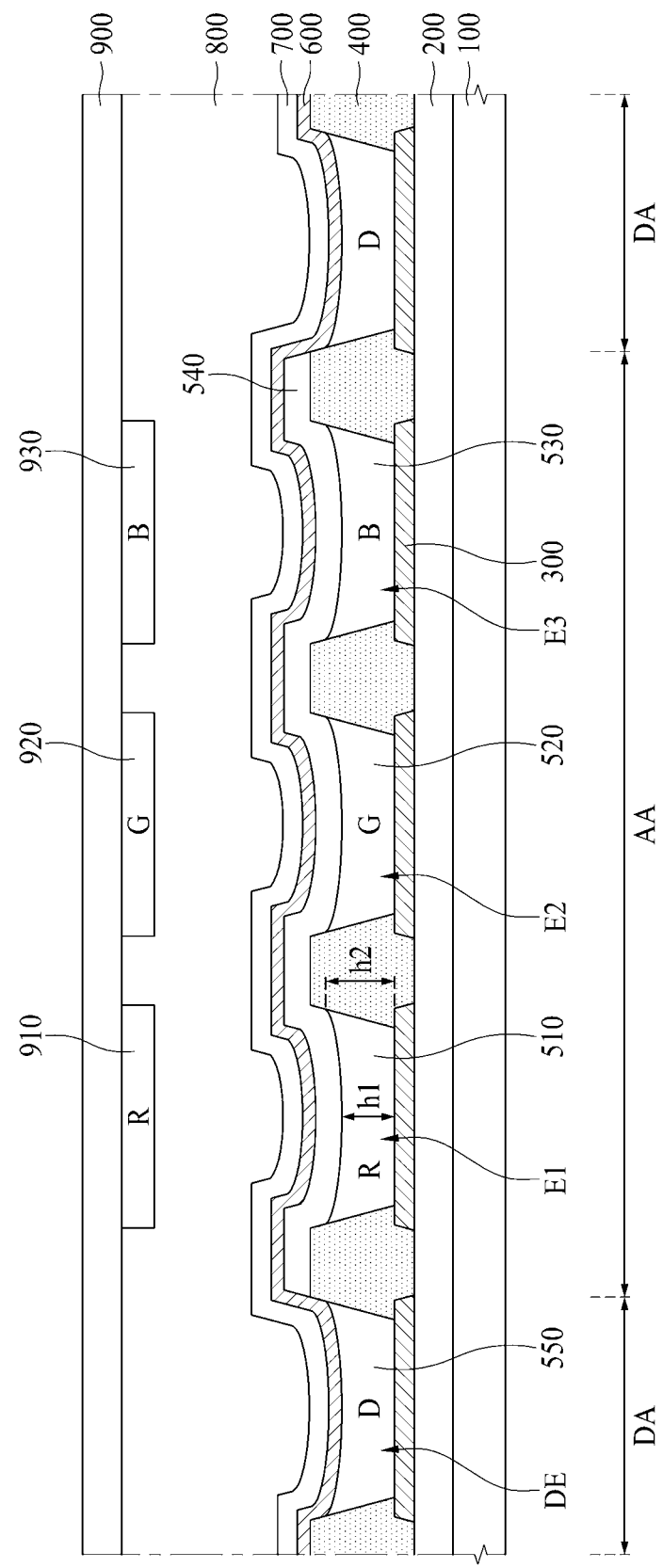
FIG. 9 is a schematic cross-sectional view of an electroluminescence display apparatus according to another embodiment of the present disclosure, taken along line I-I of FIG. 8.

FIG. 9 is a schematic cross-sectional view of an electroluminescence display apparatus according to another embodiment of the present disclosure, which corresponds to the cross-section taken along line I-I of FIG. 8 described above. FIG. 9 illustrates a state in which the active area AA has the structure according to FIG. 2 described above.

The electroluminescence display apparatus according to another embodiment of the present disclosure includes the first substrate 100, the circuit element layer 200, the first electrode 300, the bank 400, the first light emitting layer 510, the second light emitting layer 520, the third light emitting layer 530, the fourth light emitting layer 540, the dummy light emitting layer 550, the second electrode 600, the capping layer 700, the encapsulation layer 800, the second substrate 900, and the color filters 910, 920, and 930.

The circuit element layer 200 is formed in the active area AA and the dummy area DA. The circuit element layer 200 may be formed through the same process and have the same structure in the active area AA and the dummy area DA. However, the present disclosure is not limited thereto and the circuit element layer 200 formed in the dummy area DA may not include some of the signal lines such as the gate line, the data line, the power line, the reference line, and the like, or may not have some of the switching TFT and driving TFT, and thus, light emission may not be made in the dummy area DA. In some cases, the circuit element layer 200 formed in the dummy area DA may be incompletely formed so that either the switching TFT or the driving TFT does not operate.

The first electrode 300 is formed in the active area AA and the dummy area DA. The first electrode 300 may be formed through the same process and have the same structure in the active area AA and the dummy area DA. However, the first electrode 300 may not be formed in the dummy area DA, and thus, light emission may not be made in the dummy area DA.

The bank 400 is formed in the active area AA and the dummy area DA. The banks 400 may be formed through the same process and have the same structure in the active area AA and the dummy area DA.

The light emitting layers 510, 520, 530, and 540 are formed in the active area AA. Since the light emitting layers 510, 520, 530, and 540 are the same as those described above, a redundant description thereof will be omitted.

The dummy light emitting layer 550 is formed in the dummy area DA. The dummy light emitting layer 550 is formed by a solution process like the first, second, and third light emitting layers 510, 520, and 530. The dummy light emitting layer 550 may have the same structure as that of any one of the first light emitting layer 510, the second light emitting layer 520, and the third light emitting layer 530, but is not limited thereto.

A plurality of dummy light emitting layers 550 are provided in the dummy area DA and the plurality of dummy light emitting layers 550 may have the same structure. However, the present disclosure is not limited thereto and some of the dummy light emitting layer 550 may have the same structure as that of the first light emitting layer 510, some of the plurality of dummy light emitting layers 550 may have the same structure as that of the second light emitting layer 520, and the other remaining dummy light emitting layers 550 may have the same structure as that of the third light emitting layer 530.

The second electrode 600 is formed in the active area AA and the dummy area DA. The second electrode 600 may be formed through the same process and have the same structure in the active area AA and the dummy area DA.

The capping layer 700 is formed on the second electrode 600 to prevent the second electrode 600 from being damaged. The capping layer 700 may be formed to cover the entire upper surface of the second electrode 600 in the active area AA and the dummy area DA.

The encapsulation layer 800 may be formed on the capping layer 700 in the active area AA and the dummy area DA.

The color filters 910, 920, and 930 are formed on the inner surface of the second substrate 900 facing the first substrate 100. The color filters 910, 920, and 930 may be formed only in the active area AA, not in the dummy area DA. However, the color filters 910, 920, and 930 may be formed in the dummy area DA.

Figure 10:
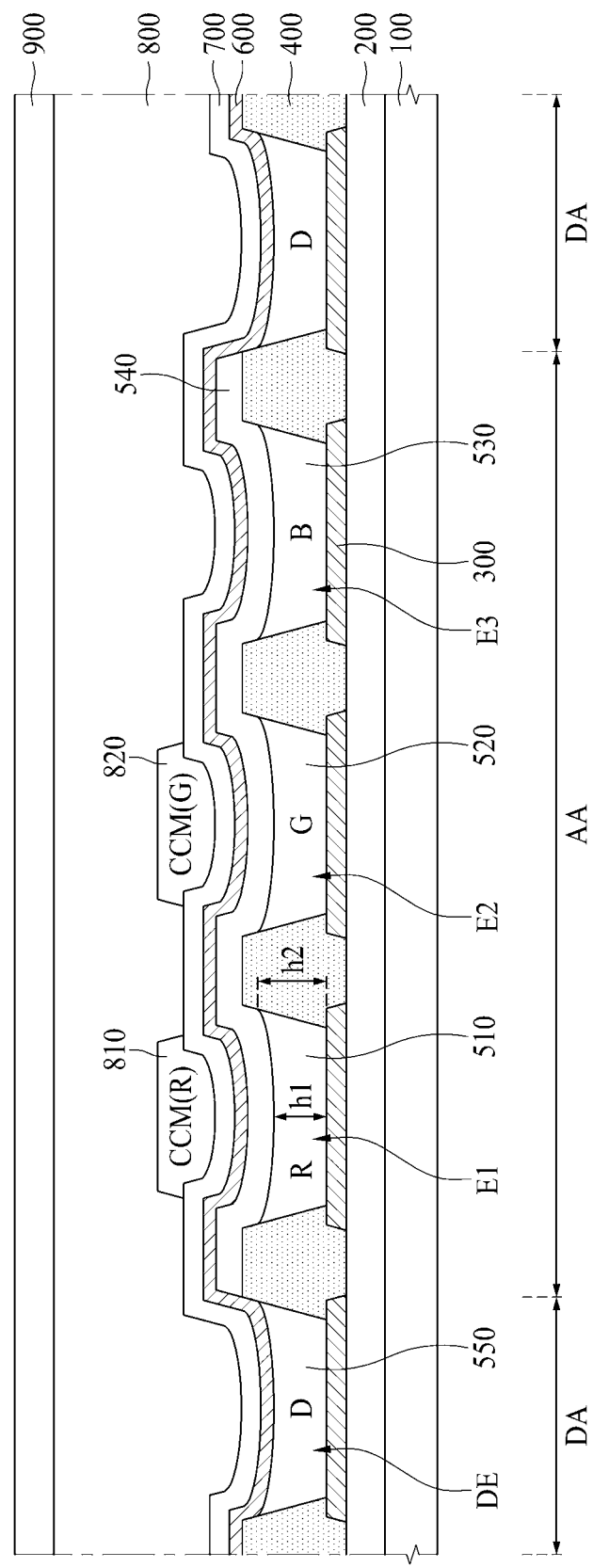
FIG. 10 is a schematic cross-sectional view of an electroluminescence display apparatus according to another embodiment of the present disclosure, taken along line I-I of FIG. 8.

FIG. 10 is a schematic cross-sectional view of an electroluminescence display apparatus according to another embodiment of the present disclosure, which corresponds to the cross-section taken along line I-I of FIG. 8 described above. FIG. 10 is the same as the structure according to FIG. 9 described above, except that the active area AA has the structure according to FIG. 5 described above. Therefore, only the different components will be described below.

As illustrated in FIG. 10, color filters 910, 920, and 930 are not provided on the inner surface of the second substrate 900, and instead, color conversion materials 810 and 820 are formed between the capping layer 700 and the encapsulation layer 800. However, in the structure of FIG. 10, the color filters 910, 920, and 930 are additionally provided on the inner surface of the second substrate 900 so that the active area AA may have the structure according to FIG. 6 described above.

The color conversion materials 810 and 820 may not to be formed in the dummy area DA, and thus, the color conversion materials 810 and 820 may be formed only in the active area AA.

In FIGS. 9 and 10, the bank 400 may include the first bank 410 and the second bank 420 as illustrated in FIG. 7.

According to the present disclosure, red light is emitted from the first light emitting layer, green light is emitted from the second light emitting layer, and blue light is emitted from each of the third light emitting layer and the fourth light emitting layer. Therefore, since blue light is emitted from the two light emitting layers, luminous efficiency of blue light may be improved. In particular, in the present disclosure, since the fourth light emitting layer is formed through a deposition process, rather than through a solution process, damage to the first light emitting layer, the second light emitting layer, and the third light emitting layer provided below the fourth light emitting layer may be prevented.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescence display apparatus comprising:
a substrate including an active area and a dummy area provided on an outer side of the active area;
a bank on the substrate, the bank defining a first light emitting area, a second light emitting area, and a third light emitting area of the substrate;
a first light emitting layer provided in the first light emitting area, the first light emitting layer configured to emit light of a first color;
a second light emitting layer provided in the second light emitting area, the second light emitting layer configured to emit light of a second color;
a third light emitting layer provided in the third light emitting area, the third light emitting layer configured to emit light of a third color;
a fourth light emitting layer provided on the first light emitting layer, the second light emitting layer, the third light emitting layer, and the bank; and
an electrode covering and contacting the fourth light emitting layer, the electrode overlapping the active area and the dummy area,
wherein the fourth light emitting layer is configured to emit light of the third color that is also emitted by the third light emitting layer,
wherein the electrode covers and contacts the dummy light emitting layer,
wherein the fourth light emitting layer is provided in the active area without being provided in the dummy area, and
wherein the dummy light emitting layer includes a first dummy light emitting layer, a second dummy light emitting layer, and a third dummy light emitting layer, the first dummy light emitting layer has a same structure as that of the first light emitting layer, the second dummy light emitting layer has a same structure as that of the second light emitting layer, and the third dummy light emitting layer has a same structure as that of the third light emitting layer.

2. The electroluminescence display apparatus of claim 1, wherein
a thickness of the first light emitting layer is greater than a thickness of the second light emitting layer and a thickness of the third light emitting layer, and the thickness of the second light emitting layer is greater than the thickness of the third light emitting layer, and
the fourth light emitting layer comprises a substantially uniform thickness in the first light emitting area, the second light emitting area, and the third light emitting area.

3. The electroluminescence display apparatus of claim 1, wherein
the first light emitting layer comprises a first hole transporting layer and a first light emitting material layer configured to emit light of the first color, wherein the first color is red,
the second light emitting layer comprises a first hole transporting layer and a second light emitting material layer configured to emit light of the second color, wherein the second color is green,
the third light emitting layer comprises a first hole transporting layer and a third light emitting material layer configured to emit light of the third color, wherein the third color is blue, and
the fourth light emitting layer comprises at least one of a first electron injecting layer and a first electron transporting layer, a charge generation layer, a second hole transporting layer, a fourth light emitting material layer configured to emit light of the third color, and a second electron transporting layer.

4. The electroluminescence display apparatus of claim 1, wherein
the first light emitting layer comprises a first hole transporting layer, a first light emitting material layer configured to emit light of the first color, wherein the first color is red, and at least one of a first electron injecting layer and a first electron transporting layer,
the second light emitting layer comprises a first hole transporting layer, a second light emitting material layer configured to emit light of the second color, wherein the second color is green, and at least one of a first electron injecting layer and a first electron transporting layer,
the third light emitting layer comprises a first hole transporting layer, a third light emitting material layer configured to emit light of the third color, wherein the third color is blue, and at least one of a first electron injecting layer and a first electron transporting layer, and
the fourth light emitting layer comprises a charge generation layer, a second hole transporting layer, a fourth light emitting material layer configured to emit light of the third color, and a second electron transporting layer.

5. The electroluminescence display apparatus of claim 1, further comprising:
a first color filter overlapping the first light emitting layer; and
a second color filter overlapping the second light emitting layer,
wherein each of the first color filter and the second color filter at least partially block transmission of light emitted from the fourth light emitting layer.

6. The electroluminescence display apparatus of claim 1, further comprising:
a first color conversion material overlapping the first light emitting layer and a second color conversion material overlapping the second light emitting layer,
wherein the first color conversion material converts light emitted from the fourth light emitting layer having the third color into the first color, and
the second color conversion material converts light emitted from the fourth light emitting layer having the third color into the second color.

7. The electroluminescence display apparatus of claim 1, further comprising:
a first color conversion material overlapping the first light emitting layer, a first color filter overlapping the first color conversion material, a second color conversion material overlapping the second light emitting layer, and a second color filter overlapping the second color conversion material,
wherein the first color conversion material converts light emitted from the fourth light emitting layer having the third color into the first color, and
the second color conversion material converts light emitted from the fourth light emitting layer having the third color into the second color of light emitted from the second light emitting layer.

8. The electroluminescence display apparatus of claim 1, wherein a thickness of a first portion of the first light emitting layer at a center of the first light emitting area is less than a thickness of a second portion of the first light emitting layer that is in contact with the bank.

9. The electroluminescence display apparatus of claim 1, further comprising:
an additional electrode provided below the first light emitting layer, the second light emitting layer, and the third light emitting layer; and
a capping layer provided on the electrode.

10. An electroluminescence display apparatus comprising:
a substrate including an active area and a dummy area provided on an outer side of the active area;
a bank on the substrate, the bank defining a plurality of light emitting areas in the active area on the substrate and defining a plurality of dummy light emitting areas in the dummy area on the substrate, wherein the plurality of light emitting areas are configured to emit light and the plurality of dummy light emitting areas do not emit light;
a first light emitting layer, a second light emitting layer, and a third light emitting layer respectively provided in the plurality of light emitting areas, the first light emitting layer configured to emit light of a first color, the second light emitting layer configured to emit light of a second color, and the third light emitting layer configured to emit light of a third color;
a fourth light emitting layer on the first light emitting layer, the second light emitting layer, the third light emitting layer, and the bank in the active area, the fourth light emitting layer configured to emit light of the third color that is also emitted by the third light emitting layer;
a dummy light emitting layer provided in each of the plurality of dummy light emitting areas; and
an electrode covering and contacting each of the fourth light emitting layer and the dummy light emitting layer, the electrode overlapping the active area and the dummy area,
wherein the fourth light emitting layer is provided in the plurality of light emitting areas without being provided in the dummy area, and
wherein the dummy light emitting layer includes a first dummy light emitting layer, a second dummy light emitting layer, and a third dummy light emitting layer, the first dummy light emitting layer has a same structure as that of the first light emitting layer, the second dummy light emitting layer has a same structure as that of the second light emitting layer, and the third dummy light emitting layer has a same structure as that of the third light emitting layer.

11. The electroluminescence display apparatus of claim 10, further comprising:
a first color filter overlapping the first light emitting layer and a second color filter overlapping the second light emitting layer in the active area,
wherein each of the first color filter and the second color filter at least partially block transmission of light emitted from the fourth light emitting layer.

12. The electroluminescence display apparatus of claim 11, wherein the first color filter and the second color filter are not provided in the dummy area.

13. The electroluminescence display apparatus of claim 10, further comprising:

a first color conversion material overlapping the first light emitting layer and a second color conversion material overlapping the second light emitting layer in the active area,
wherein the first color conversion material converts light emitted from the fourth light emitting layer having the third color into the first color, and
the second color conversion material converts light emitted from the fourth light emitting layer having the third color into the second color.

14. The electroluminescence display apparatus of claim 13, wherein the first color conversion material and the second color conversion material are not provided in the dummy area.

15. The electroluminescence display apparatus of claim 10, wherein
the first light emitting layer comprises a first hole transporting layer and a first light emitting material layer configured to emit light of the first color, wherein the first color is red,
the second light emitting layer comprises a first hole transporting layer and a second light emitting material layer configured to emit light of the second color, wherein the second color is green,
the third light emitting layer comprises a first hole transporting layer and a third light emitting material layer configured to emit light of the third color, wherein the third color is blue, and
the fourth light emitting layer comprises at least one of a first electron injecting layer and a first electron transporting layer, a charge generation layer, a second hole transporting layer, a fourth light emitting material layer configured to emit light of the third color, and a second electron transporting layer.

16. The electroluminescence display apparatus of claim 10, wherein
the first light emitting layer comprises a first hole transporting layer, a first light emitting material layer configured to emit light of the first color, wherein the first color is red, and at least one of a first electron injecting layer and a first electron transporting layer,
the second light emitting layer comprises a first hole transporting layer, a second light emitting material layer configured to emit light of the second color, wherein the second color is green, and at least one of a first electron injecting layer and a first electron transporting layer,
the third light emitting layer comprises a first hole transporting layer, a third light emitting material layer configured to emit light of the third color, wherein the third color is blue, and at least one of a first electron injecting layer and a first electron transporting layer, and
the fourth light emitting layer comprises a charge generation layer, a second hole transporting layer, a fourth light emitting material layer configured to emit light of the third color, and a second electron transporting layer.

17. A display device, comprising:
a substrate including an active area and a dummy area provided on an outer side of the active area; and
a plurality of pixels arranged on the substrate, at least one pixel including:
a first subpixel configured to emit light of a first color;
a second subpixel configured to emit light of a second color;
a third subpixel configured to emit light of a third color; and a fourth subpixel overlapping the first subpixel, the second subpixel, and the third subpixel, wherein the fourth subpixel is configured to emit light that is of a same color as one of the first subpixel, the second subpixel, or the third subpixel, and an electrode covering and contacting the fourth subpixel, the electrode overlapping the active area and the dummy area, wherein the electrode covers and contacts the dummy light emitting layer, wherein the fourth light emitting layer is provided in the active area without being provided in the dummy area, and wherein the dummy light emitting layer includes a first dummy light emitting layer, a second dummy light emitting layer, and a third dummy light emitting layer, the first dummy light emitting layer has a same structure as that of the first light emitting layer, the second dummy light emitting layer has a same structure as that of the second light emitting layer, and the third dummy light emitting layer has a same structure as that of the third light emitting layer.

18. The display device of claim 17, wherein the fourth subpixel emits light of the third color.

19. The display device of claim 17, wherein a first light emitting area of the first subpixel, a second light emitting area of the second subpixel, and a third light emitting area of the third subpixel are defined by a bank, and wherein a size of the first light emitting area, a size of the second light emitting area, and a size of the third light emitting area are substantially the same.

20. The display device of claim 17, further comprising:

a first color filter overlapping the first subpixel and the fourth subpixel;

a second color filter overlapping the second subpixel and the fourth subpixel; and a third color filter overlapping the third subpixel and the fourth subpixel, wherein each of the first color filter and the second color filter at least partially block transmission of light emitted from the fourth subpixel.

\* \* \* \* \*